(12) United States Patent
Marutani

(10) Patent No.: US 11,430,924 B2
(45) Date of Patent: Aug. 30, 2022

(54) WAVELENGTH CONVERSION COMPONENT AND LIGHT EMITTING DEVICE INCLUDING THE SAME

(71) Applicant: NICHIA CORPORATION, Anan (JP)

(72) Inventor: Yukitoshi Marutani, Anan (JP)

(73) Assignee: NICHIA CORPORATION, Anan (JP)

( * ) Notice: Subject to any disclaimer, the term of this patent is extended or adjusted under 35 U.S.C. 154(b) by 105 days.

(21) Appl. No.: 16/750,868

(22) Filed: Jan. 23, 2020

(65) Prior Publication Data

US 2020/0243727 A1 Jul. 30, 2020

(30) Foreign Application Priority Data

Jan. 30, 2019 (JP) .............................. JP2019-014454

(51) Int. Cl.
*H01L 33/50* (2010.01)
*H01L 33/64* (2010.01)
*H01L 33/58* (2010.01)

(52) U.S. Cl.
CPC .......... *H01L 33/504* (2013.01); *H01L 33/505* (2013.01); *H01L 33/507* (2013.01); *H01L 33/58* (2013.01); *H01L 33/644* (2013.01)

(58) Field of Classification Search
CPC ..... H01L 33/504; H01L 33/644; H01L 33/58; H01L 33/507; H01L 33/505
See application file for complete search history.

(56) References Cited

U.S. PATENT DOCUMENTS

| | | | | |
|---|---|---|---|---|
| 9,978,727 | B2 * | 5/2018 | Takeya | ................. H01L 27/124 |
| 2010/0038665 | A1 | 2/2010 | Sugiura et al. | |
| 2012/0033402 | A1 | 2/2012 | Harada | |
| 2013/0248893 | A1 | 9/2013 | Sugizaki | |
| 2014/0264412 | A1 * | 9/2014 | Yoon | ..................... H01L 33/504 257/98 |
| 2015/0362165 | A1 * | 12/2015 | Chu | ....................... H01L 27/156 362/235 |
| 2018/0074372 | A1 * | 3/2018 | Takeya | .............. G02F 1/133514 |
| 2019/0041701 | A1 * | 2/2019 | Chen | ................... H01L 25/0753 |
| 2019/0195466 | A1 * | 6/2019 | Shimizu | ................ H01L 33/508 |
| 2019/0198716 | A1 * | 6/2019 | Gordon | ................. H01L 27/156 |
| 2019/0198723 | A1 * | 6/2019 | Basin | ...................... H01L 33/60 |

FOREIGN PATENT DOCUMENTS

| | | |
|---|---|---|
| JP | 2009-177106 A | 8/2009 |
| JP | 2012-038862 A | 2/2012 |
| JP | 2013-201192 A | 10/2013 |
| JP | 2015011796 A | 1/2015 |
| JP | 2017-224707 A | 12/2017 |
| JP | 2018-107298 A | 7/2018 |
| JP | 2018-205438 A | 12/2018 |
| KR | 20140092083 A | 7/2014 |
| WO | 2008044759 A1 | 4/2008 |

* cited by examiner

*Primary Examiner* — Eugene Lee

(74) *Attorney, Agent, or Firm* — Global IP Counselors, LLP

(57) ABSTRACT

A wavelength conversion component includes a plurality of wavelength conversion members, a plurality of transmission type optical members respectively disposed on the wavelength conversion members, and a first member including a plurality of wall portions respectively located between adjacent ones of the wavelength conversion members. A light emitting device includes such wavelength conversion component.

10 Claims, 12 Drawing Sheets

WAVELENGTH CONVERSION COMPONENT AND LIGHT EMITTING DEVICE INCLUDING THE SAME

CROSS-REFERENCE TO RELATED APPLICATION

This application claims priority to Japanese Patent Application No. 2019-014454 filed on Jan. 30, 2019, the disclosure of which is hereby incorporated by reference in its entirety.

BACKGROUND

The present disclosure relates to a wavelength conversion component and a light emitting device including the wavelength conversion component.

There are light emitting devices including a combination of a semiconductor light emitting element and a wavelength conversion member.
In such a light emitting device, for example, excitation light emitted from a blue light emitting diode or a blue semiconductor laser is irradiated to a phosphor-containing wavelength conversion member to cause wavelength-conversion to obtain yellow light. The yellow light is mixed with the blue light emitted from the blue light emitting diode or the blue semiconductor laser to emit white light (for example, see Japanese Unexamined Patent Application Publication No. 2017-224707).

SUMMARY

In such a light emitting device, a portion of the excitation light is absorbed by the phosphor-containing wavelength conversion member, and light wavelength-converted by the phosphor-containing wavelength conversion member and another portion of excitation light that is not absorbed by the phosphor-containing wavelength conversion member are incident on a transparent plate at an emission side, and are mixed and emitted from an outer surface of the transparent plate. Light emitted from the transparent plate can be broadly distributed, such that the light emitted from the transparent plate includes a light emitted in the direction perpendicular to the outer surface of the transparent plate, a light emitted in a direction parallel to the outer surface of the transparent plate, and a light emitted in the direction between these directions. When the light emitted from the wavelength conversion member has a broad light distribution, utilization efficiency of the light emitted from the light emitting device in a system using the light emitting device tends to be reduced. One object of the present invention is to provide a wavelength conversion component that can narrow the light distribution of the light emitted from the wavelength conversion member, and a light emitting device including the wavelength conversion component.

A wavelength conversion component includes a plurality of wavelength conversion members, a plurality of transmission type optical members respectively located on the wavelength conversion members, and a first member including a plurality of wall portions respectively located between adjacent ones of the wavelength conversion members.

According to certain embodiments of the present invention, a wavelength conversion component that allows emitted light to have narrow light distribution, and a light emitting device including the wavelength conversion component.

DETAILED DESCRIPTION

Figure 1A:
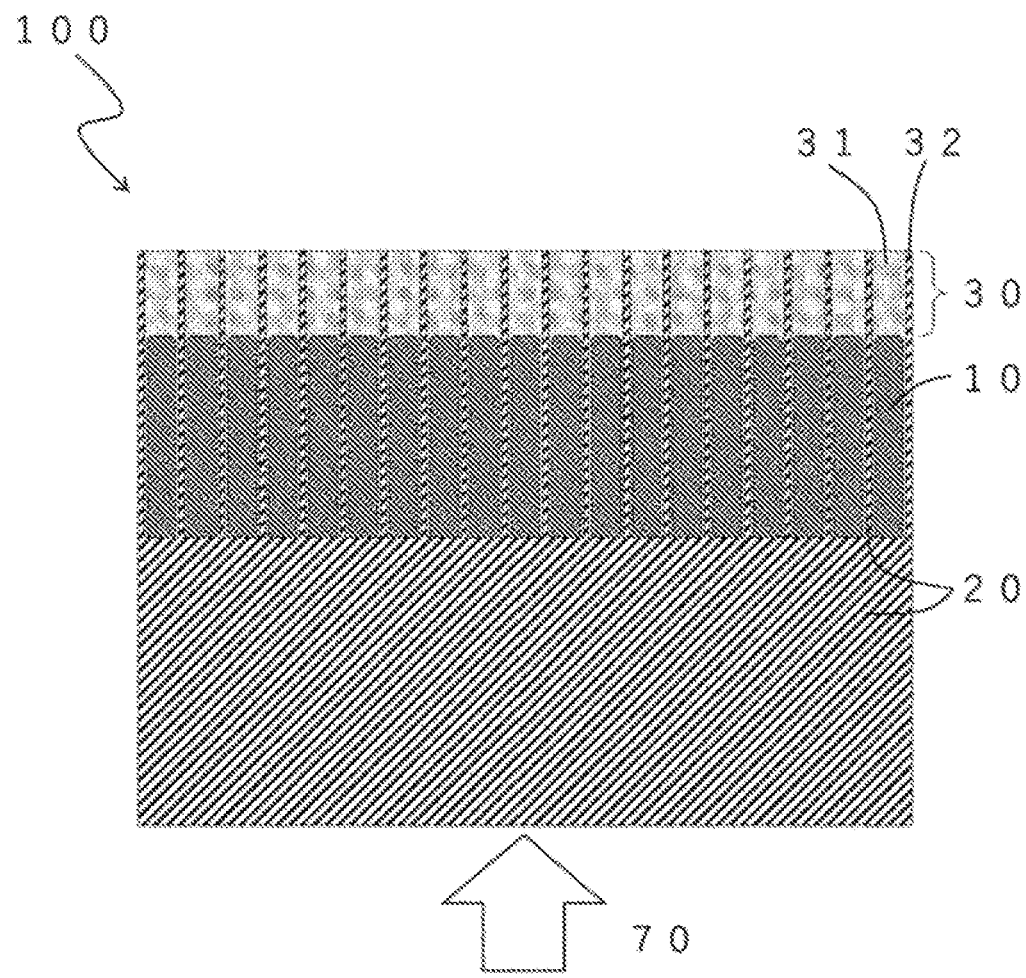
FIG. 1A is a schematic, vertical cross-sectional diagram showing a wavelength conversion component according to a first embodiment.

Certain embodiments of the present invention will be described below. The embodiments described below are intended as illustrative to give a concrete form to technical ideas of the present invention, and the scope of the invention is not limited to the embodiments described below. The present invention may include combinations of the embodiments shown hereafter. Also, the sizes, materials, shapes, the relative positions and the like of the members are occasionally shown exaggerated for ease of explanation. Furthermore, in the description below, the same designations or the same reference numerals denote the same or like members, and duplicative descriptions thereof will be appropriately omitted.

Light Emitting Device

A light emitting device includes a light emitting element and a wavelength conversion component. The light emitting device may also include other members.

Light Emitting Element

The light emitting element is a generation source of excitation light incident on the wavelength conversion component. Example of the light emitting element include a semiconductor light emitting element, a lamp, a gas laser, or a combination of two or more of these can be employed, and more specifically, a light emitting diode, a semiconductor laser, a mercury lamp, and an argon ion laser.

Wavelength Conversion Component

The wavelength conversion component includes a plurality of wavelength conversion members, and a plurality of transmission type optical elements each including a transmission type optical member. The wavelength conversion members are arrayed spaced apart from each other via corresponding wall portions of the first member.

Each transmission type optical member is placed on a respective one of the wavelength conversion members. The wavelength conversion component may further include a heat dissipation member, with a plurality of the wavelength conversion members arranged above the heat dissipation member, for example.

Wavelength Conversion Member

The wavelength conversion members are adapted to absorb excitation light, and to generate light of a different wavelength from the wavelength of the excitation light. For the wavelength conversion members, for example, phosphor crystal particles, fluorescent dye, semiconductor microcrystal, or a light-transmissive solid or a light-transmissive liquid containing one or more of these materials can be used.

Transmission Type Optical Member

The transmission type optical members are adapted to transmit light emitted from each wavelength conversion member. An optical thin film can be disposed on a surface of each transmission type optical member.

The transmission type optical members can solely constitute transmission type optical elements, or a combination of the transmission type optical members and second members can constitute transmission type optical elements. In other words, structural elements constituting the transmission-type optical element can be solely the transmission type optical members disposed on the wavelength conversion members, or a combination of the transmission-type optical members and portions of the second member adjacent to the transmission type optical members. The transmission-type optical element has an array of the transmission-type optical members corresponding to the array of the wavelength conversion members. This structure allows for efficiently transmitting light emitted from each wavelength conversion member. The array of the transmission type optical members is preferably self-aligned with the array of the wavelength conversion members. This allows for eliminating necessity for aligning the array of transmission type optical members with the array of the wavelength conversion members. For the transmission type optical element, a lens, a light guide, or a combination of these can be used. Examples of the lens used for the transmission type optical element include a convex lens, a rod lens, etc. For the light guide, for example, a collective body of pipes each having the inner surface being a mirror surface, light pipes, step index optical fibers, or the like can be used. For example, structural elements of the transmission-type optical element respectively including the transmission-type optical members and portions of the second member adjacent to the transmission type optical members function as the light pipes.

First Member, Second Member

The first member is configured to demarcate individual wavelength conversion members.

In other words, the plurality of wavelength conversion members are located with the first member between adjacent wavelength conversion members.

The first member can have a structure in which a plurality of wall portions configured to demarcate individual wavelength conversion members are formed in a single body, defining a plurality of through-holes, such that adjacent ones of the wavelength conversion members are spaced apart from each other via corresponding wall portions of the first member. Also, the first member can have a structure including wall portions and upward facing surfaces to define a plurality of recesses. The plurality of recesses are defined by wall portions configured to demarcate individual wavelength conversion members, and by upward facing surfaces of the first member configured to cover lower surfaces of the plurality of wavelength conversion members. The first member can also be made of a light-transmissive material. Also, the first member can be made a light reflective material or a light blocking material. Alternatively, the first member can be made of a combination of a light-transmissive material, a light reflective material, and a light shielding material.

The second member is disposed to separate the plurality of transmission type optical members. The second member has a refractive index lower than that of the transmission type optical member. With such a refractive index, light propagated in the transmission type optical member can be easily totally-reflected on a surface of the second member. Also, when the transmission type optical member is a rod lens, the transmission type optical member may not include the second member.

Different materials or the same material can be used for a material of the first member and a material of the second member. For example, wall portions of the first member can extend upward with respect to the upper end of the wavelength conversion member, and the transmission type optical members can be spaced apart from each other via corresponding extending wall portions of the first member. This allows the array of the transmission type optical members to be self-aligned to the array of the wavelength conversion members.

Heat Dissipation Member

The heat dissipation member propagates heat that is generated in the wavelength conversion members, and dissipates heat to outside of the wavelength conversion members. The heat dissipation member is disposed below the plurality of wavelength conversion members to cover the plurality of wavelength conversion members. Metal materials such as Cu, Al, diamond, silicon carbide (SiC), aluminum nitride (AlN), sapphire ($Al_2O_3$), etc., can be suitably used for a material of the heat-dissipating member.

Other Members

The light emitting device can further include members other than the light emitting element and the wavelength conversion component. The light emitting device can further include, for example, a casing of the light emitting device, a drive power supply of the light emitting element, an optical member, etc.

First Embodiment

Figure 1B:
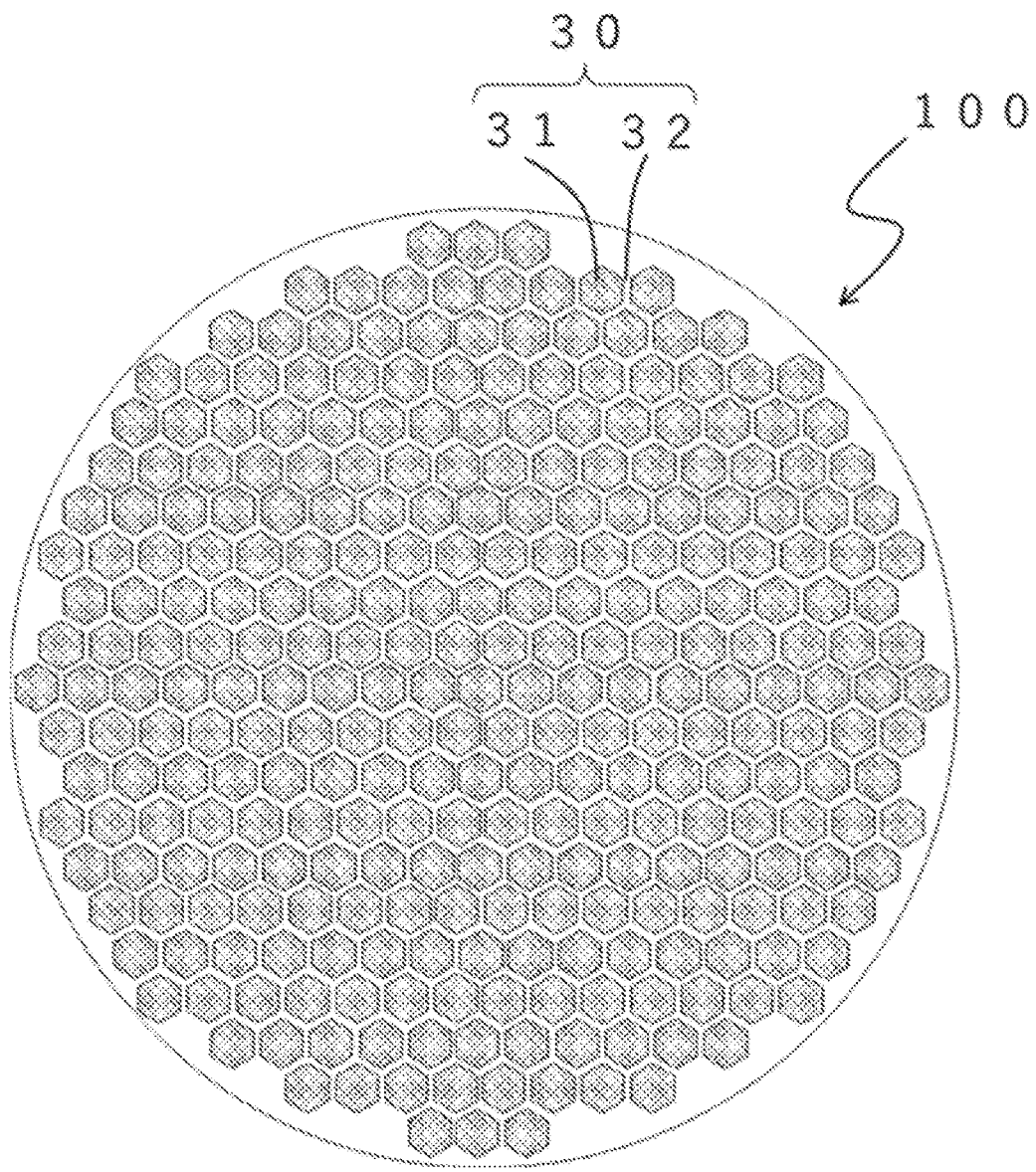
FIG. 1B is a schematic plan diagram of the wavelength conversion component of FIG. 1A.

The structure of a wavelength conversion component 100 of a first embodiment will be described below with reference to FIG. 1A and FIG. 1B.

For wavelength conversion members 10, phosphor crystal particles, fluorescent glass particles, phosphor fine particle dispersed resin, semiconductor fine particle dispersed resin, fluorescent-dye-containing resin, fluorescent-dye-containing liquid, etc., can be used. Examples of the phosphor crystal particles include various types of phosphor crystal particles such as columnar ZnO crystal particles, YAG crystal particles, CASN crystal particles, α-SiAlON crystal particles, etc. Examples of the fluorescent glass particles include glass that contains various types of rare earth elements (Tb, Eu, Pr, etc., for example). Examples of the phosphor-fine-particle-dispersed resin include a silicone resin in which perovskite quantum dots, ZnO fine particles, YAG fine particles, CASN fine particles, SiAlON fine particles, silicate phosphor fine particles, or the like are dispersed. Examples of the semiconductor-fine-particle-dispersed resin include a silicone resin in which CdSe/ZnS core shell type semiconductor quantum dots, InP/ZnS core shell type semiconductor quantum dots, AgInS/GaS core shell type semiconductor quantum dots, or the like are disposed. Examples of the fluorescent-dye-containing resin include acrylic resin in which a fluorescent dye such as rhodamine is dispersed. Examples of the fluorescent-dye-containing liquid include silicone oil in which a fluorescent dye such as rhodamine is dispersed. The material, shape, and dimensions of the wavelength conversion members 10 can be selected as appropriate according to the design of the wavelength conversion component 100.

For the wavelength conversion members 10, for example, columnar crystal particles of β-sialon which is a green phosphor (diameter of approximately 5 μm×length of approximately 35 μm) can be preferably used. When blue excitation light is irradiated on the columnar crystal particles of green phosphor, green light is emitted from both end surfaces of the columnar crystal along the long axis of the columnar crystal particles with an intensity greater than an intensity of green light emitted from lateral surfaces of the columnar crystal particles. Because the refractive index of the phosphor crystals is higher than the refractive index of material surrounding the phosphor crystals, when green light generated in the inside of the phosphor crystal is incident on the lateral surface of the phosphor crystal at an angle greater than the critical angle, the incident green light is totally reflected and incident on an end surface of the phosphor crystal in the long axis direction at an angle smaller than the critical angle, and accordingly easily emitted to outside the phosphor crystals.

Figure 1C:
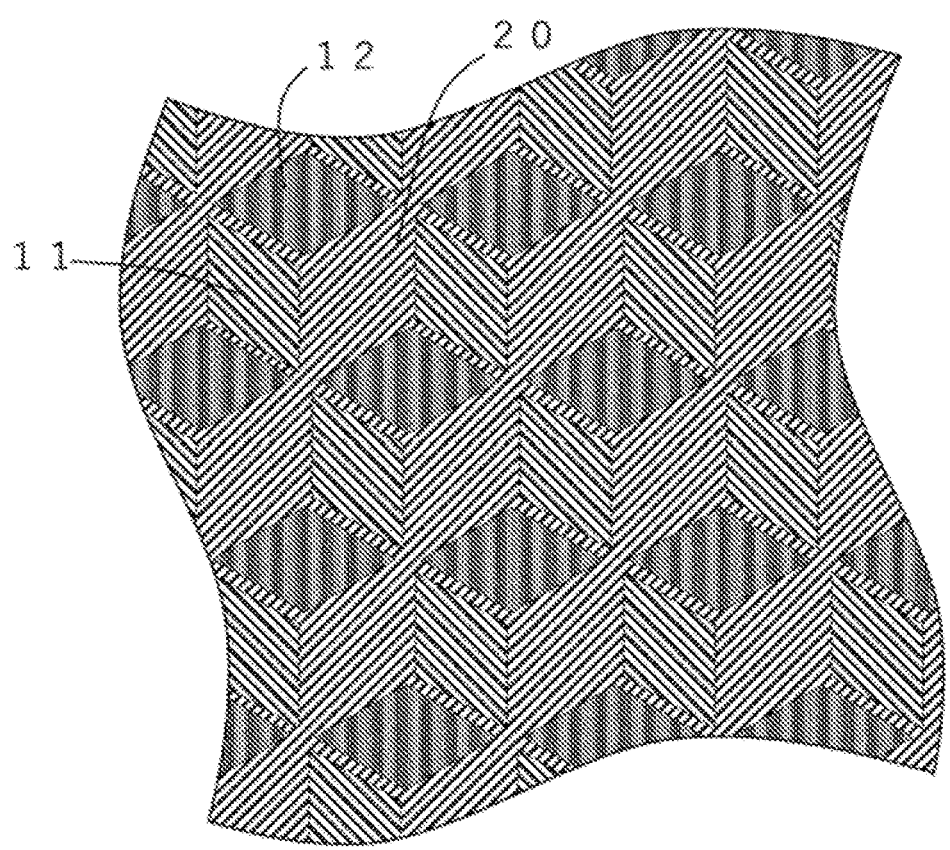
FIG. 1C is a schematic, partially enlarged horizontal cross-sectional diagram of the plurality of wavelength conversion members and the first member according to a modification example of the wavelength conversion component according to the first embodiment.

For the wavelength conversion members 10, two or more types of phosphor crystal particles, fluorescent glass particles, phosphor fine particle dispersed resin, semiconductor fine particle dispersed resin, fluorescent dye-containing resin, fluorescent dye-containing liquid, semiconductor multilayer film, or the like may be used. For example, the wavelength conversion members 10 can contain YAG crystal particles as a first wavelength conversion member 11, and CASN crystal particles as a second wavelength conversion member 12, and as shown in FIG. 1C, the first and second wavelength-conversion members 11 and 12 can be arranged in a mosaic arrangement. Furthermore, the wavelength conversion members 10 may further include a third wavelength conversion member, a fourth wavelength conversion member, a fifth wavelength conversion member, and/or further additional wavelength conversion members. The number of types, material, shape, dimension, and arrangement of the wavelength conversion members 10 can be selected as appropriate according to the design of the wavelength conversion component 100.

For a first member 20, a plate made of transparent glass, transparent resin, white resin, or the like, defining a plurality of recesses can be used. In the present specification, "transparent glass" refers to glass with high transparency, such as optical glass, for example, quartz glass, crown glass, or flint glass. Also, "transparent resin" refers to resin with high transparency, such as epoxy resin, silicone resin, polymethyl methacrylate resin, polyethylene terephthalate resin, or polycarbonate resin. Also, "white resin" refers to a transparent resin containing dispersed fine particles having a refractive index different from that of the transparent resin, such as fine particles including silica, calcium carbonate, barium sulfate, titanium oxide, hollow particles, resin beads, or the like, which are called a light diffusing agent. The material, shape, and dimensions of the first member 20 can be selected as appropriate according to the design of the wavelength conversion component 100.

When the wavelength conversion members 10 are housed in respective ones of the plurality of recesses of the first member 20, the wavelength conversion members 10 are spaced apart from each other via corresponding wall portions of the first member 20. Alternatively, the wavelength conversion members 10 and the corresponding portions of the first member 20 may be arranged in a prescribed pattern by first preparing the plurality of the wavelength conversion members 10 each surrounded by a respective member constituting a part of the first member 20, and then gathering and bonding the respective members to each other.

Examples of the first member 20 include a quartz glass plate, which is a transparent glass, defining a plurality of recesses with a honeycomb shape (i.e., arranged in an equilateral triangle lattice) formed in a surface of the quartz glass plate using a micro-processing technique that employs photolithography and reactive ion etching. For example, each of the recesses has a depth of 50 μm and a hexagonal shape in a plan view as shown in FIG. 1B, and the wall portions defining the recesses have a thickness of 1 μm. Furthermore, for example, the distance between two opposite walls in each of the recesses is 6 μm. That is, the arrangement interval of the plurality of recesses can be 7 μm. The first member, which includes walls defining the recesses, may extend upward with respect to the upper ends of the wavelength conversion members. In each recess, for example, a respective one of β-sialon columnar crystal particles (diameter of approximately 5 μm×length of approximately 35 μm) is housed. In this case, the excitation light 70 is transmitted from below the first member 20, and is incident on lower portions and lateral portions of the β-sialon columnar crystal particles, which are the wavelength conversion members 10. Each of the β-sialon columnar crystal particles is a single crystal particle rather than aggregated particles. Accordingly, no interface is present inside each β-sialon columnar crystal particle, which allows reduction of light scattering, and the β-sialon columnar crystal particles has good heat conduction. Thus, the β-sialon columnar crystal particles are preferably employed. A region extending over a depth of 15 μm on a side of the upward-facing opening of each recess forms a portion of a light pipe 30 that extends upward beyond the upper end of the wavelength conversion member 10. In the embodiment shown in FIG. 1A, the light pipes 30 include transmission type optical members 31 and portions of the first member, which also serve as the second members 32.

While each recess has a hexagonal shape in a plan view in the description above, each recess may have a triangular shape, a square shape, an oval shape, a circular shape, etc., in a plan view. In a plan view, each recess preferably has a planar shape that allows a planar configuration of multiple repetitions of the planar shape closely fitted together, which allows for increasing the density of the wavelength conversion members 10.

Also, for example, for the first member 20, a honeycomb structure including walls with high reflectance (a honeycomb structure made of white thermosetting resin, for example) can be employed. When employing a honeycomb structure, the excitation light 70 is emitted from below the first member 20 and is incident on the wavelength conversion members 10, and light emitted laterally from the wavelength conversion members 10 is reflected by the first member 20. That is, light emitted from the wavelength conversion component 100 is constituted of light emitted upward from the wavelength conversion members 10. Accordingly, for example, when the plurality of wavelength conversion members 10 contain two or more types of wavelength conversion member, variation in emission color according to the emission angle of the emitted light can be reduced. Also, absorption or scattering of light emitted from one of the wavelength conversion members by another wavelength conversion member can be reduced.

When manufacturing the first member 20, a processing technique can be selected as appropriate according to the material, shape, dimensions, etc. of the first member 20, and various processing techniques can be employed in combination. Examples of the processing technique include photolithography and reactive ion etching, compression molding, nano-imprinting, anodic oxidation, a technique in which a collective body of glass tubes is fused, stretched and sliced, etc.

For example, the wavelength conversion component according to the present embodiment allows for narrowing the light distribution of the emitted light using the light pipes 30 including the transmission type optical members 31 and the second member 32.

For the transmission type optical members 31, for example, high refractive index silicone resin rods (refractive index: 1.57) can be used. For the second member 32, for example, a quartz glass wall (refractive index: 1.46) can be used. The high refractive index silicone resin rods serving as the transmission type optical members 31 are disposed on respective columnar crystal particles of β-sialon which serve as the wavelength conversion members 10. The light pipes are made of the quartz glass wall and the high refractive index silicone resin. The green light emitted from the columnar crystal particles of β-sialon are transmitted through the interior of the high refractive index silicone resin rods, reflected at the interface with the quartz glass wall, and emitted from upper surfaces of the high refractive index silicone resin rods. Because the numerical aperture of the light pipes is determined according to the refractive index of the high refractive index silicone resin rods and the refractive index of the quartz glass wall, light distribution of light emitted from the light pipe 30 can be narrower than that when including no light pipe 30 including the transmission type optical member 31 and the second member 32.

Figure 1D:
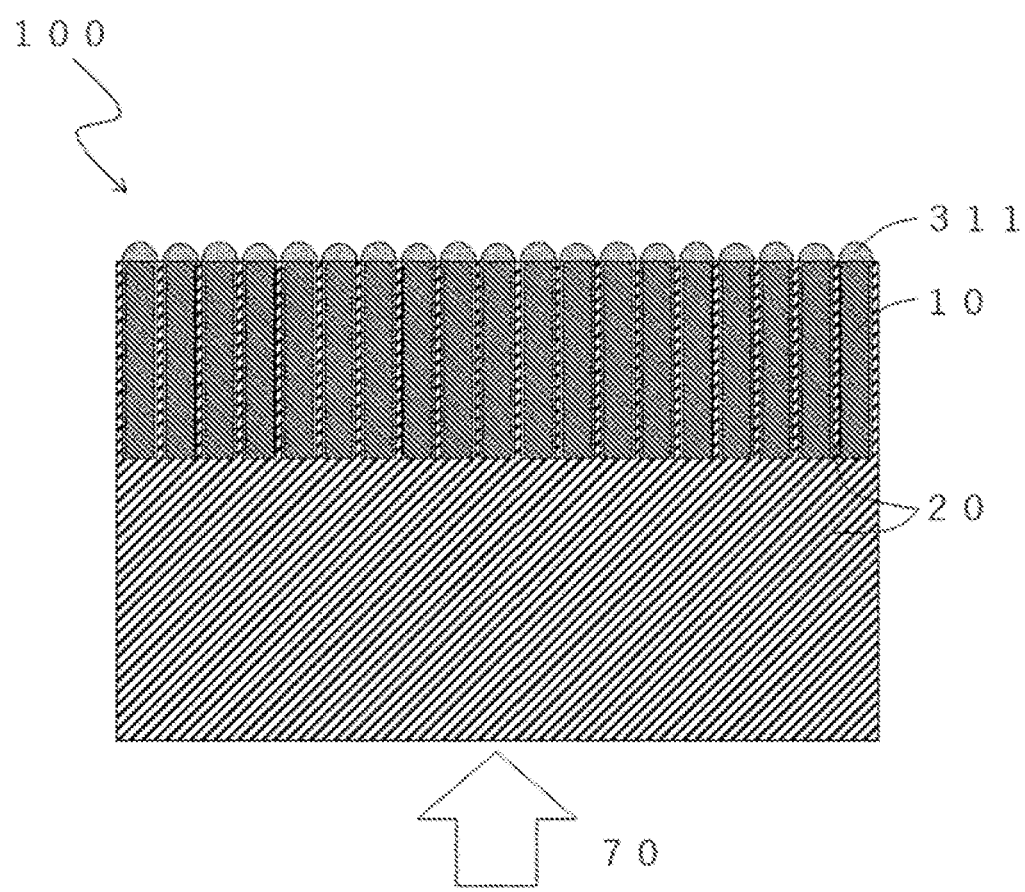
FIG. 1D is a schematic vertical cross-sectional diagram showing Modification Example 1, which is another modification example, of the wavelength conversion component according to the first embodiment.
Figure 1E:
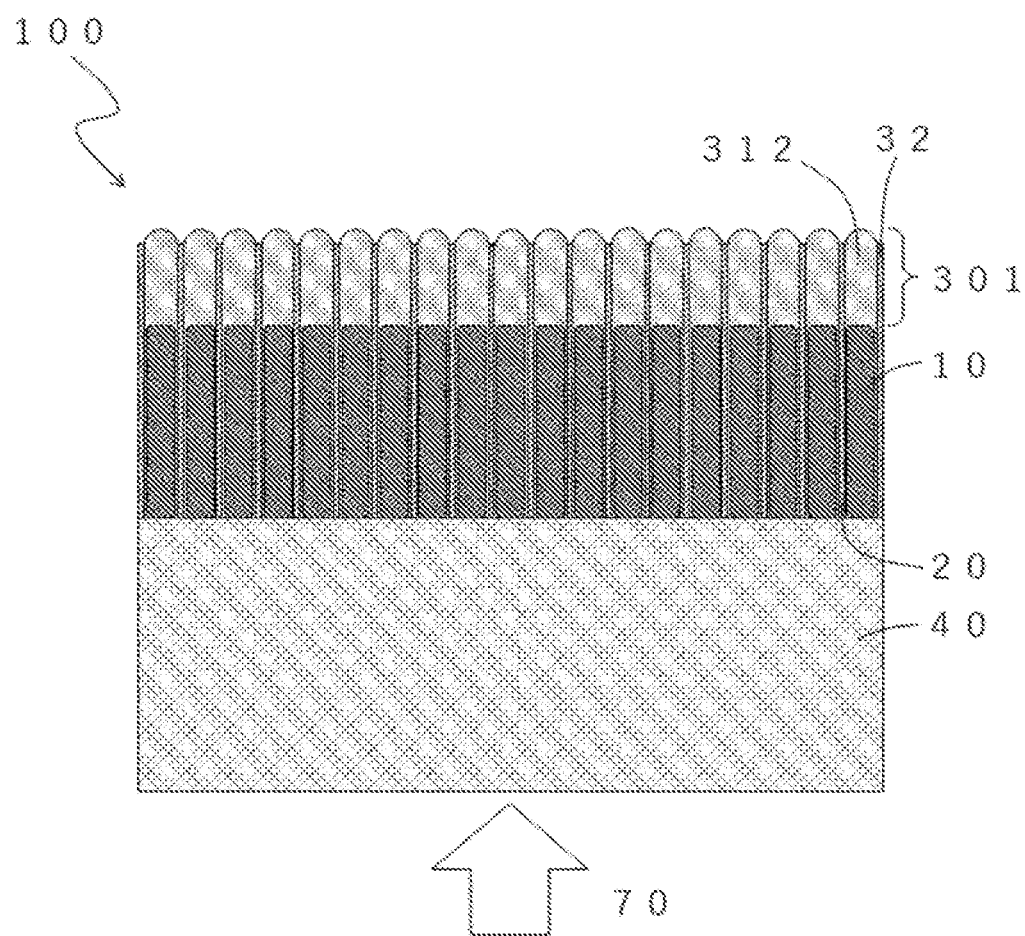
FIG. 1E is a schematic vertical cross-sectional diagram showing Modification Example 2, which is yet another modification example, of the wavelength conversion component according to the first embodiment.
Figure 1F:
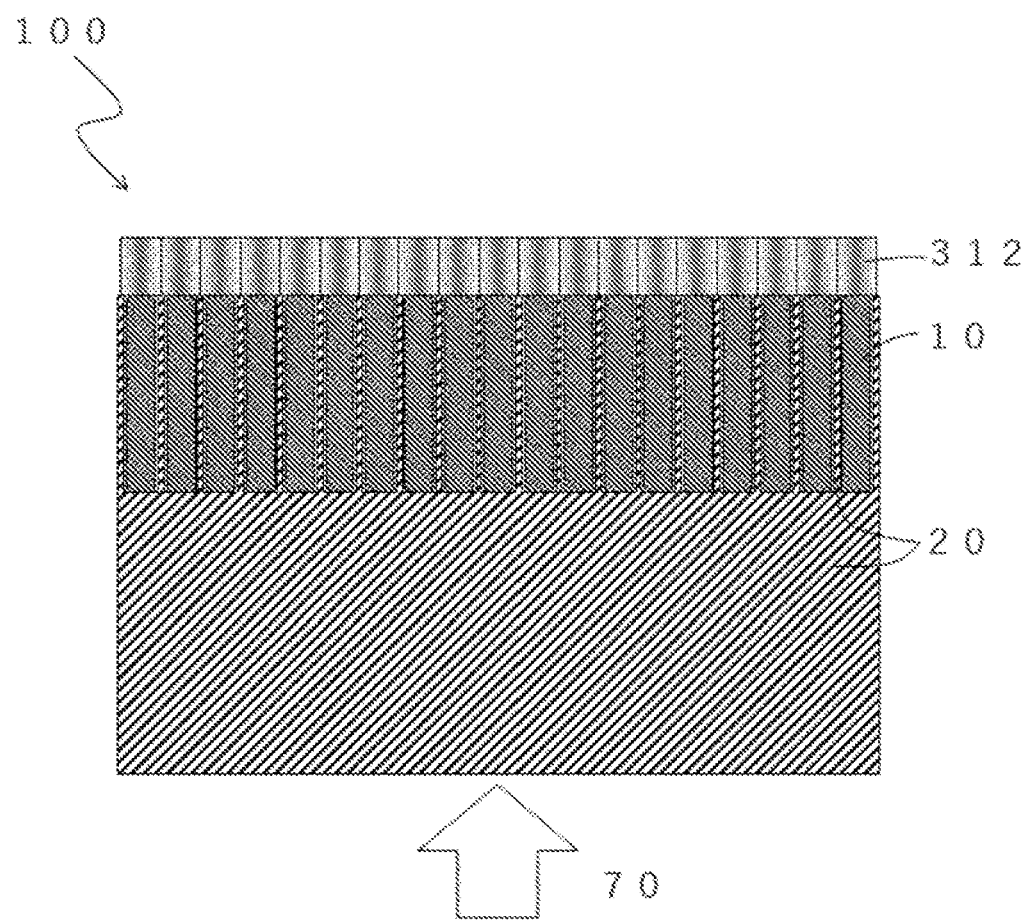
FIG. 1F is a schematic vertical cross-sectional diagram showing Modification Example 3, which is yet another modification example, of the wavelength conversion component according to the first embodiment.
Figure 1G:
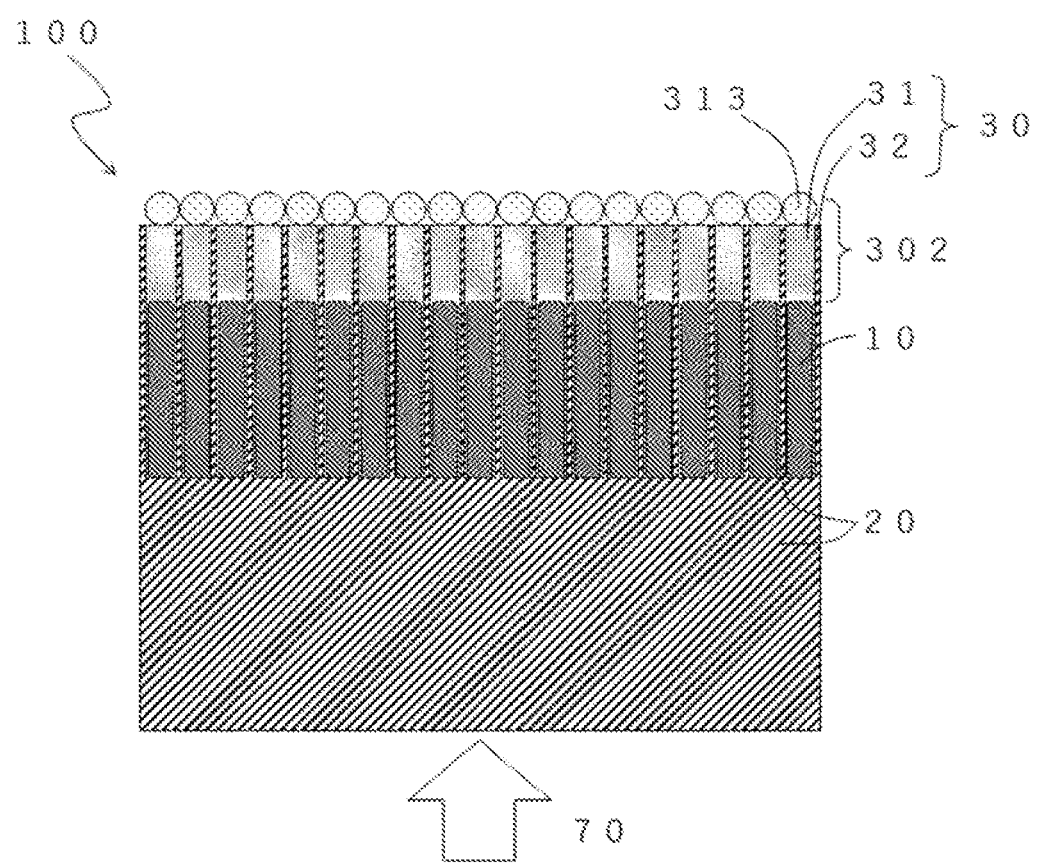
FIG. 1G is a schematic vertical cross-sectional diagram showing yet another Modification Example 4, which is yet another modification example, of the wavelength conversion component according to the first embodiment.
Figure 1H:
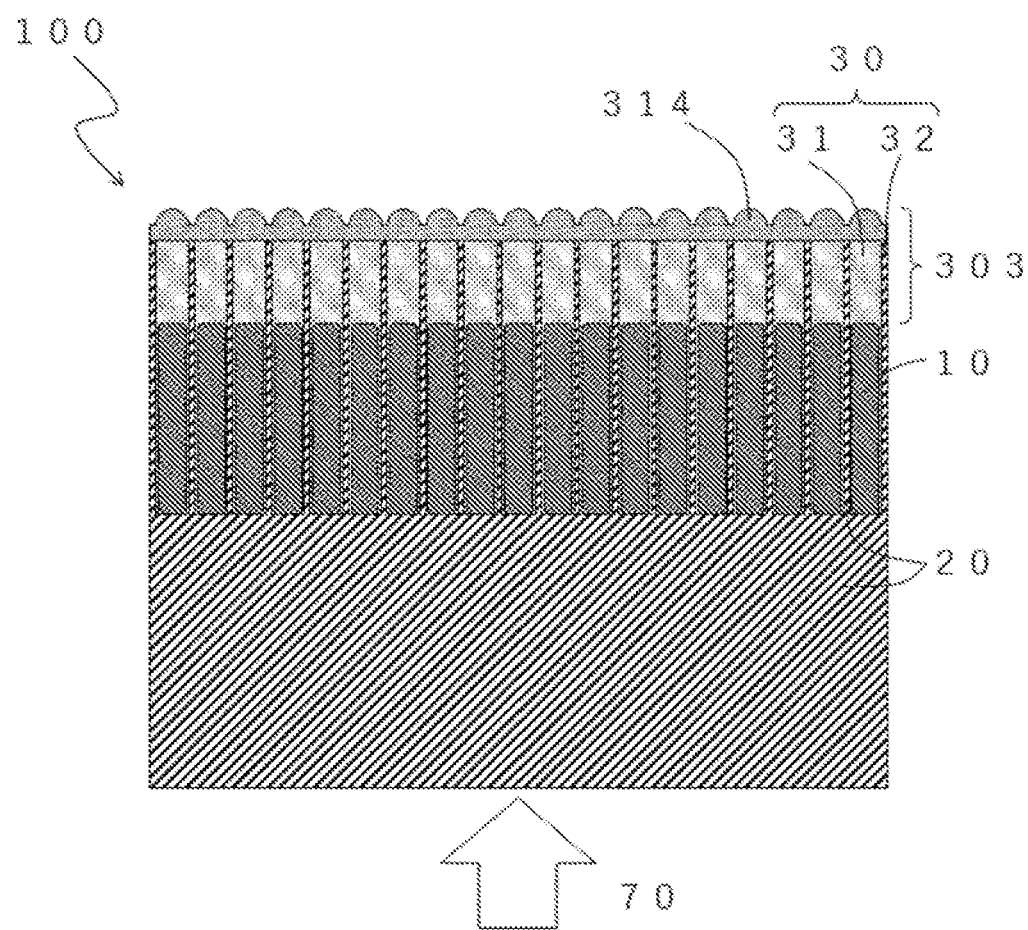
FIG. 1H is a schematic vertical cross-sectional diagram showing Modification Example 5, which is yet another modification example, of the wavelength conversion component according to the first embodiment.

Alternatively, for example, as shown in FIG. 1D, a convex lens 311 may be disposed on each of the wavelength conversion members 10. Further alternatively, for example as shown in FIG. 1E, a transmission type optical element 301 that includes the second member 32 and a transmission type optical member 312, in which a columnar light-transmissive member and a convex lens are integrated, may be disposed on each of the wavelength conversion members 10. Still further alternatively, for example as shown in FIG. 1F, the rod lens 312 may be disposed on each of the wavelength conversion members 10. Yet further alternatively, for example, a transmission type optical element 302 including a lens 313, such as an Sift spherical lens, disposed on the light pipe 30 may be disposed on each of the wavelength conversion members 10 (FIG. 1G). Even further alternatively, for example, a group of transmission type optical elements 303 including a microlens array 314 and a plurality of the light pipes 30 may be disposed on the plurality of wavelength conversion members 10 (FIG. 1H). In these modification examples, the group of the transmission type optical elements include an array of transmission type optical members corresponding to the array of the wavelength conversion members.

When the wavelength conversion member 10 absorbs the excitation light and emits light of a wavelength longer than the excitation light, the energy corresponding to the Stokes shift is generated as heat. When the heat is accumulated in the wavelength conversion member 10 to increase the temperature of the wavelength conversion member 10, the wavelength conversion efficiency of the wavelength conversion member 10 generally decreases. For reducing such decrease in wavelength conversion efficiency, it is effective to dispose the wavelength conversion member 10 on the heat dissipation member 40.

Also, in the wavelength conversion component according to the present embodiment, the wavelength conversion members 10 can be spaced apart from each other via corresponding wall portions of the first member, and the transmission type optical members 31 may be spaced apart from each other via corresponding wall portions of the second member. As shown in FIG. 1A and FIG. 1B, the first member 20 and the second member 32 can be made of the same material, or the second member 32 can be formed on the first member 20 using a material different from a material of the first member 20. As shown in FIG. 1B, the upper surface of the transmission type optical member 31 has a hexagonal shape, and the second member 32 has a honeycomb structure as in the first member 20 described above. For example, a transparent substrate with good thermal conductivity (sapphire substrate, AlN substrate, SiC substrate, diamond substrate, quartz glass, etc.) can be used for the first member 20, and white resin can be used for the second member 32.

Also, for example as shown in FIG. 1E, when using the same resin with high transparency for the first member 20 and the second member 32, a transparent substrate with good thermal conductivity (e.g., sapphire substrate, AlN substrate, SiC substrate, diamond substrate, or a combination of two or more of these) can be bonded below the second member 32 and the plurality of the wavelength conversion members 10, to serve as the heat dissipation member 40.

Second Embodiment

The structure of a wavelength conversion component 200 according to a second embodiment will be described hereafter with reference to FIG. 2A and FIG. 2B.

The wavelength conversion component 200 has a semiconductor multilayer film 16 that includes a quantum well layer 161. The semiconductor multilayer film 16 can also include an excitation light absorption layer 162, a composition gradient layer 163, and a carrier confinement layer 164 that are located at a lower side, an upper side, or both upper and lower sides of the quantum well layer 161. It is also preferable to have a total reflection mirror 165 at the lower side of the semiconductor multilayer film. For the total reflection mirror, a metal layer of Ag, etc., or a dielectric multilayer film can be used. The light emission spectrum of light emitted from the quantum well layer 161 has a narrow half band width. The wavelength conversion component 200 can be preferably used for, for example, an application to a light source for a projector that uses a color filter.

For a first member 201, for example, an $SiO_2$ film can be used. Alternatively, a compound member of an $SiO_2$ film and an air layer, or a compound member of an $SiO_2$ film and a solder layer, etc., can be used for the first member 201.

Figure 2A:
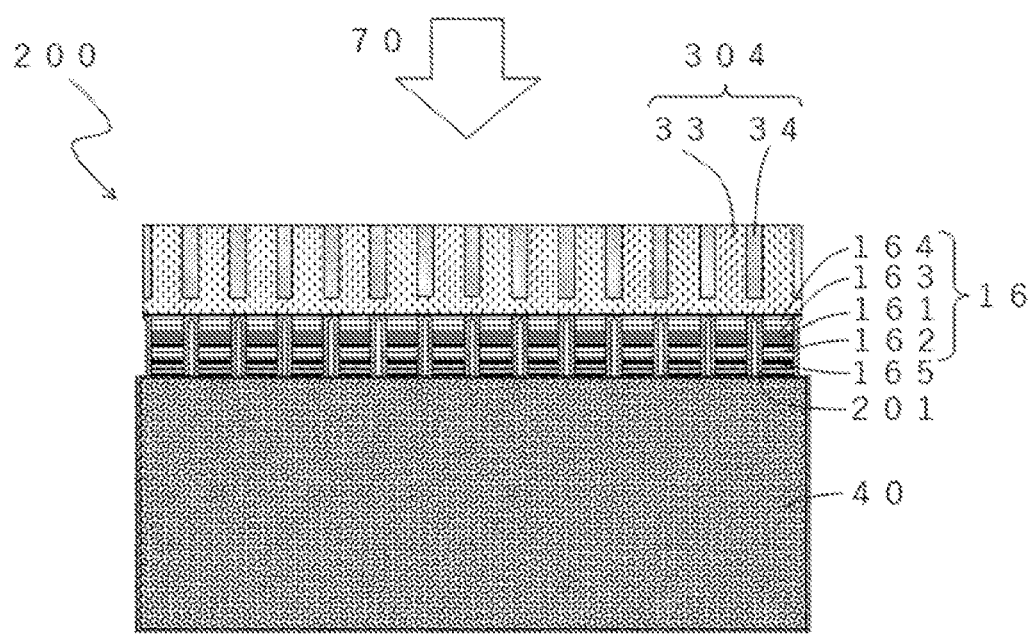
FIG. 2A is a schematic vertical cross-sectional diagram of the wavelength conversion component according to a second embodiment.
Figure 2B:
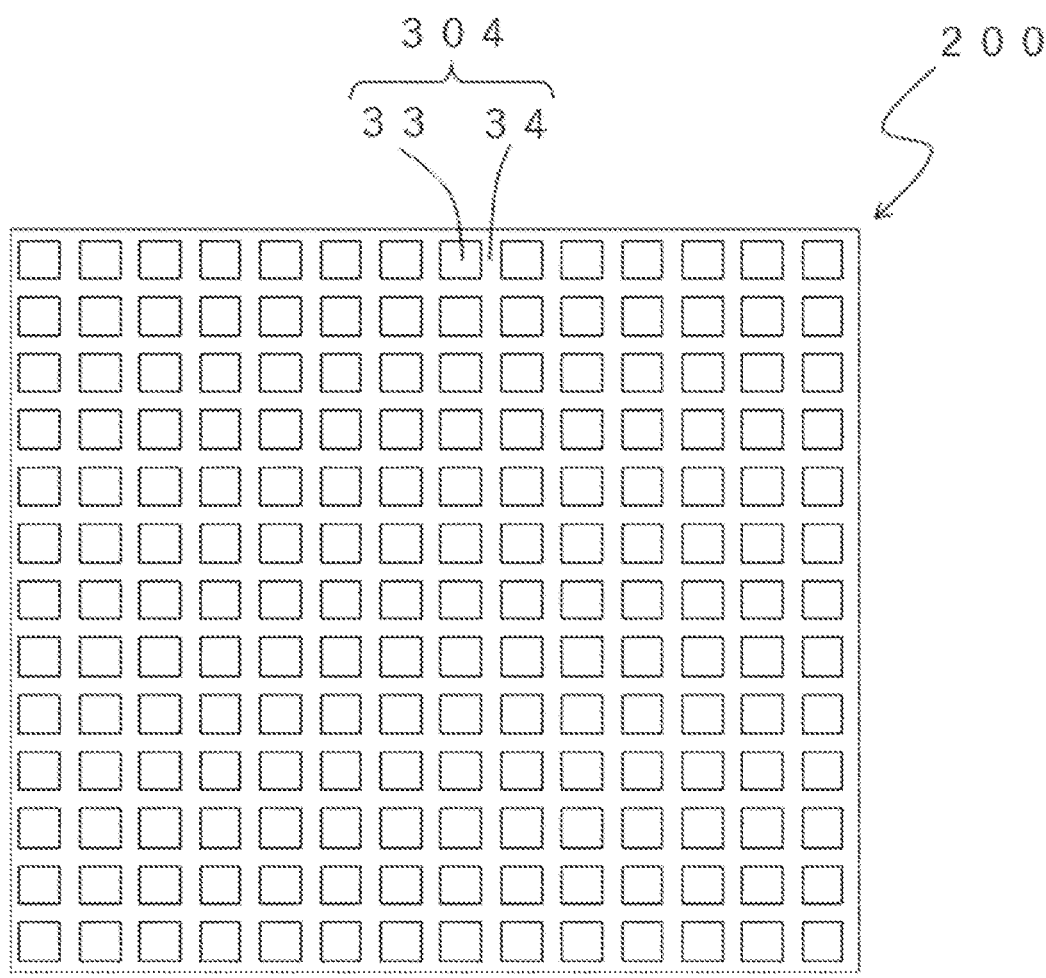
FIG. 2B is a schematic plan diagram of the wavelength conversion component of FIG. 2A.

For a transmission-type optical element 304, for example as shown in FIG. 2A, light pipes (example of transmission-type optical members in this embodiment) each having a sapphire core 33 (refractive index: 1.77) and a transparent silicone resin cladding 34 (refractive index: 1.57) surrounding the sapphire core 33 can be used. The light pipe 304 disposed on the semiconductor multilayer film 16 that functions as the plurality of wavelength conversion members can be arranged in, for example, a square lattice form as shown in FIG. 2B.

Examples of the heat dissipation member 40 include a gold plated copper block.

The reflective type wavelength conversion component 200 according to the second embodiment can be formed, for example, as described below. With a sapphire substrate serving as the growth substrate for growing the semiconductor multilayer film 16, the nitride semiconductor multilayer film 16 containing the quantum well layer 161 configured to emit green light is crystal-grown using an MOCVD method. Thereafter, the total reflection mirror 165 is formed on the semiconductor multilayer film 16. Grooves are formed to divide the semiconductor multilayer film 16 and the total reflection mirror 165 into predetermined regions, and the grooves are covered by the $SiO_2$ film, to form the first member 201. For formation of the total reflection mirror, the grooves, and the $SiO_2$ film, a general semiconductor wafer process (photolithography, sputtering, CVD, dry etching, etc.) can be employed. Then, the sapphire substrate with the semiconductor multilayer film 16 and the total reflection mirror 165 is inverted, and is bonded to the gold plated copper block such that a total reflection mirror 165 faces the gold plated copper block. After polishing the sapphire substrate to have a predetermined thickness, the groove is formed to demarcate the sapphire substrate, forming a plurality of the sapphire cores 33. A transparent silicone resin is injected in the groove and cured to obtain the cladding 34, so that the transmission type optical element including a plurality of the light pipes 304 is obtained. The transmission type optical element has an array of light pipes corresponding to the array of the divided semiconductor multilayer films 16.

Figure 2C:
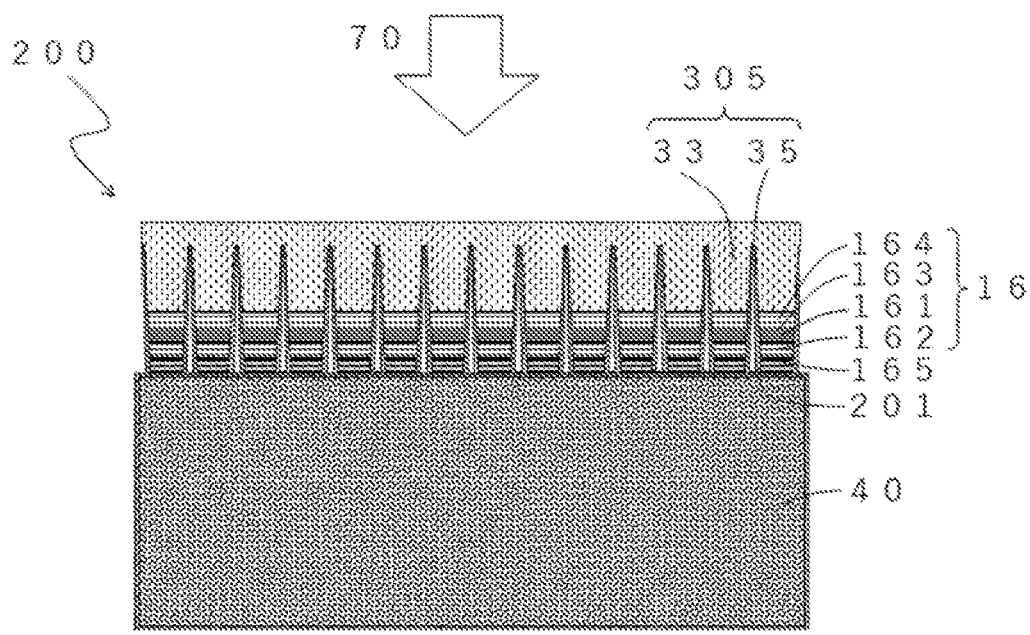
FIG. 2C is a schematic vertical cross-sectional diagram showing a modification example of the wavelength conversion component according to the second embodiment.

Also, for example, as a light pipe 305, which is a structural element of the transmission type optical element, as shown in FIG. 2C, the light pipe in which each of the plurality of sapphire cores 33 is surrounded by a respective one of claddings 35 having a wedge shape in a cross-sectional view may be used. In each of the grooves dividing the semiconductor multilayer film 16 and the total reflection mirror 165, a deep groove is formed in the sapphire substrate, and the cladding 35 is disposed to extend to the sapphire substrate. This allows the array of the transmission type optical members to be self-aligned to the array of the wavelength conversion members. The cladding 35 is a portion of the first member 201 that extends upward of the interface between the semiconductor multilayer film 16, which functions as the wavelength conversion members, and the sapphire substrate. Such a structure causes the sapphire core 33 to have a shape that expands upward (inverted frustum pyramid shape), which allows for narrowing distribution of the light emitted from the reflective type wavelength conversion component 200, and thus is preferable. For forming the deep grooves in the sapphire substrate, for example, laser processing such as laser induced backside wet etching (LIBWE) can be employed.

Third Embodiment

Figure 3:
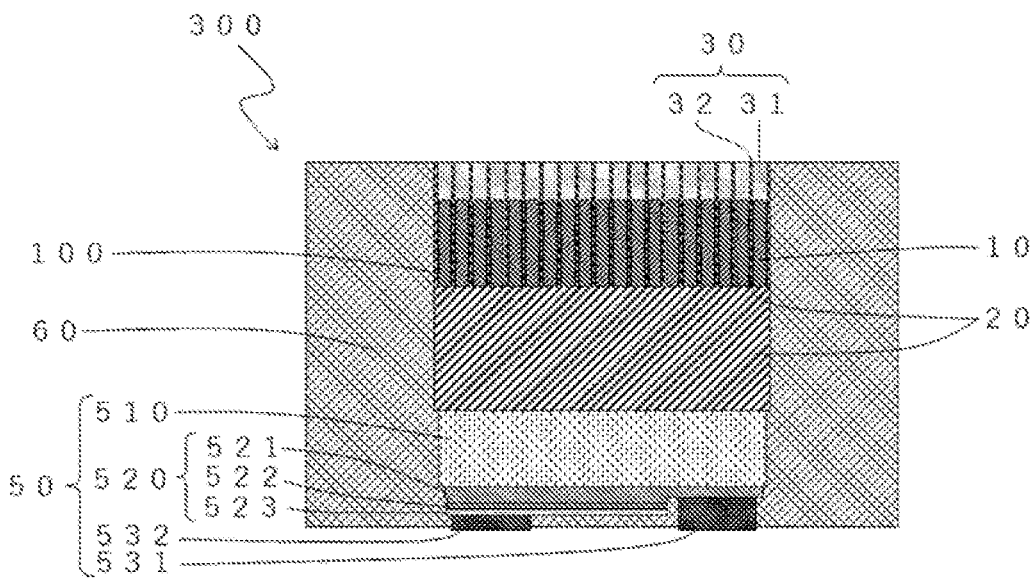
FIG. 3 is a schematic vertical cross-sectional diagram of a light emitting device according to a third embodiment.

The structure of a light emitting device 300 according to a third embodiment will be described below with reference to FIG. 3.

The light emitting device 300 includes a light emitting element 50. For the light emitting element 50, for example, a flip-chip type blue light emitting diode chip that includes an upper surface, a lower surface, an n side pad electrode 531 and a p side pad electrode 532 that are disposed on the lower surface, a sapphire substrate 510 on the upper surface, and a semiconductor multilayer film 520, which includes an n type semiconductor layer 521, a blue light emitting layer 522, and a p type semiconductor layer 523 between the p side pad electrode 532 and the sapphire substrate 510.

The light emitting device 300 includes the wavelength conversion element 100 according to the first embodiment, for example. The wavelength conversion component 100 is bonded to the sapphire substrate of the top surface of one light emitting element 50, for example.

The light emitting device 300 can further include members other than members described above. For example, the light emitting device 300 can further include light shielding lateral walls 60 that cover lateral surfaces of the light emitting element 50 and lateral surfaces of the wavelength conversion component 100. Examples of a material of the light blocking side wall 60 include a white resin and a black resin.

In the light emitting device 300, the excitation light 70 from a single light emitting element 50 is incident on the wavelength conversion component 100. The excitation light 70 is divided and incident on corresponding ones of a plurality of the wavelength conversion members 10, and a portion or all of the incident light is absorbed by the wavelength conversion members 10. Thereafter, light wavelength-converted by the phosphor-containing wavelength conversion member is emitted from the corresponding wavelength conversion members 10 and transmitted through the light pipe 30 on the corresponding wavelength conversion member 10, and is then emitted from the wavelength conversion component 100. When light emitted from the corresponding wavelength conversion members 10 is transmitted through the light pipe 30, distribution of light is narrowed.

Fourth Embodiment

Figure 4:
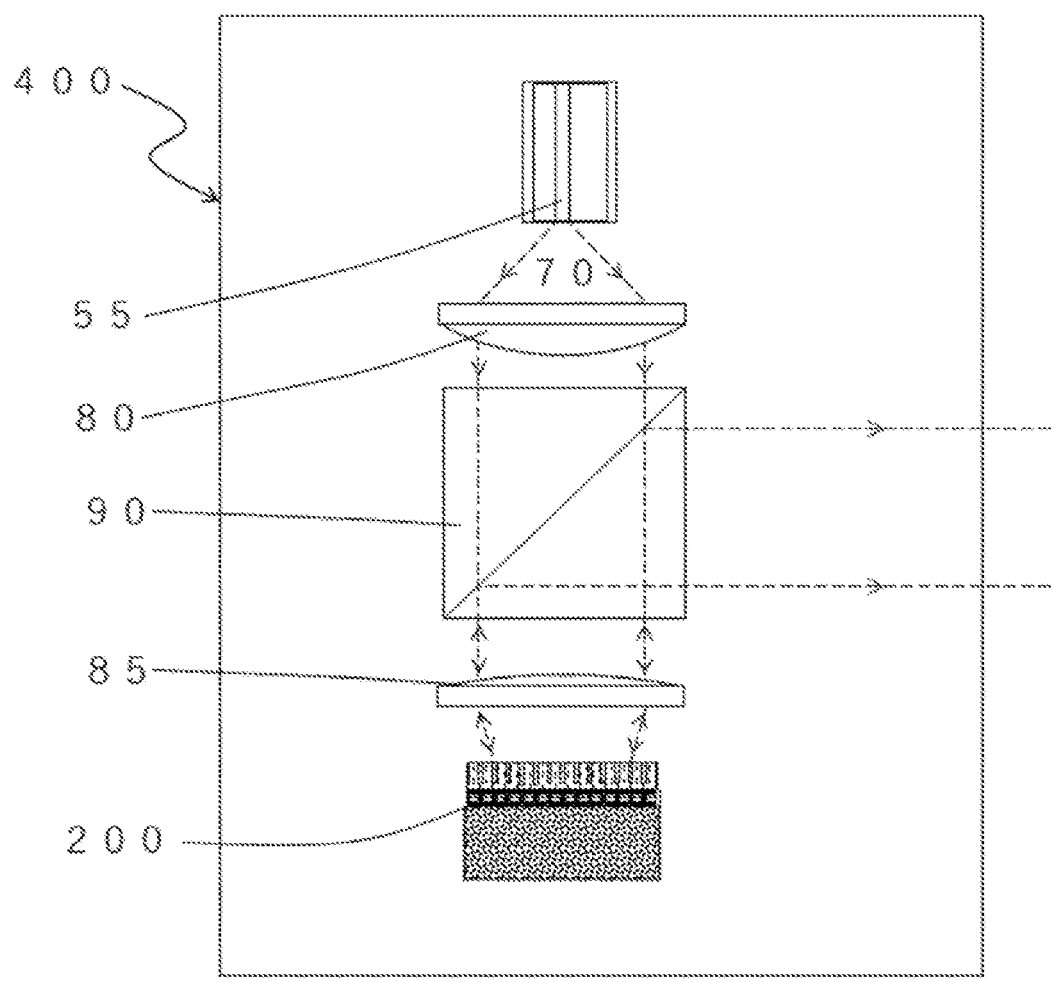
FIG. 4 is a schematic diagram of a light emitting device according to a fourth embodiment.

The structure of a reflective type light emitting device 400 according to a fourth embodiment will be described with reference to FIG. 4.

The reflective type light emitting device 400 includes a light emitting element 55. For the light emitting element 55, for example, a blue semiconductor laser can be used.

The reflective type light emitting device 400 includes the wavelength conversion component 200 according to the second embodiment, for example. An excitation light 70 from the blue semiconductor laser is transmitted through a convex lens 80 and a dichroic prism 90 and condensed by a convex lens 85, and is incident on the wavelength conversion component 200, for example. Aligning the NA of the convex lens 85 and the NA of the light pipe with each other allows for efficiently utilizing light wavelength-converted by the phosphor-containing wavelength conversion member.

The reflective type light emitting device 400 can further include members other than members described above. For example, the reflective type light emitting device 400 can further include lenses, prisms, mirrors, dichroic mirrors, wave plates, a case, etc.

In the reflective type light emitting device 400, excitation light 70 from a single light emitting element 55 is incident on the wavelength conversion component 200. The excitation light 70 is divided and incident on corresponding ones of the plurality of wavelength conversion members 10, and a portion or all of the incident light is absorbed by the corresponding wavelength conversion members 10. Thereafter, light wavelength-converted by the phosphor-containing wavelength conversion member is emitted from the corresponding wavelength conversion members 10 and transmitted through the light pipe on the wavelength conversion members 10, and is then emitted from the wavelength conversion component 200. When the light emitted from the corresponding wavelength conversion members 10 is transmitted through the light pipe, the light distribution is narrowed.

The wavelength conversion component and the light emitting device according to certain embodiments of the present invention can be used for various applications, such as various types of light sources for on-board use including head lights, a light source for a projector device, a light source for backlight device for a liquid crystal display device, a signal light device, various types of illumination devices, etc.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A wavelength conversion component comprising:
   a plurality of wavelength conversion members;
   a plurality of transmission type optical members respectively located on the wavelength conversion members; and
   a first member made of glass or resin and comprising a plurality of wall portions respectively located between adjacent ones of the wavelength conversion members, the wall portions extending upward with respect to upper ends of the wavelength conversion members such that the transmission type optical members are spaced apart from each other via the wall portions, wherein
   the transmission type optical members have a refractive index greater than a refractive index of the first member.

2. The wavelength conversion component according to claim 1, further comprising
   a heat dissipation member directly in contact with the wavelength conversion members on a side opposite to the transmission type optical members.

3. The wavelength conversion component according to claim 1, further comprising
   a heat dissipation member covering the wavelength conversion members on a side opposite to the transmission type optical members.

4. The wavelength conversion component according to claim 1, wherein
   the wavelength conversion members include a first wavelength conversion member and a second wavelength conversion member that are made of different materials.

5. The wavelength conversion component according to claim 2, wherein
   the wavelength conversion members include a first wavelength conversion member and a second wavelength conversion member that are made of different materials.

6. The wavelength conversion component according to claim 3, wherein
   the wavelength conversion members include a first wavelength conversion member and a second wavelength conversion member that are made of different materials.

7. A light emitting device comprising:
   the wavelength conversion component according to claim 1; and
   a light emitting element disposed below the wavelength conversion component.

8. A light emitting device comprising:
   the wavelength conversion component according to claim 2; and
   a light emitting element disposed below the wavelength conversion component.

9. A light emitting device comprising:
   the wavelength conversion component according to claim 3; and
   a light emitting element disposed below the wavelength conversion component.

10. A light emitting device comprising:
    the wavelength conversion component according to claim 4; and
    a light emitting element disposed below the wavelength conversion component.

* * * * *